United States Patent
Choi et al.

(10) Patent No.: US 11,749,357 B2
(45) Date of Patent: Sep. 5, 2023

(54) FEEDBACK FOR POWER MANAGEMENT OF A MEMORY DIE USING CAPACITIVE COUPLING

(71) Applicant: Micron Technology, Inc., Boise, ID (US)

(72) Inventors: Baekkyu Choi, San Jose, CA (US); Fuad Badrieh, Boise, ID (US); Thomas H. Kinsley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/094,698

(22) Filed: Jan. 9, 2023

(65) Prior Publication Data

US 2023/0162802 A1    May 25, 2023

Related U.S. Application Data

(62) Division of application No. 17/514,858, filed on Oct. 29, 2021, now Pat. No. 11,574,687, which is a division of application No. 16/798,893, filed on Feb. 24, 2020, now Pat. No. 11,177,007.

(51) Int. Cl.
| | |
|---|---|
| *G11C 5/14* | (2006.01) |
| *G11C 16/30* | (2006.01) |
| *G06F 1/28* | (2006.01) |
| *G06F 1/3296* | (2019.01) |

(52) U.S. Cl.
CPC ............. *G11C 16/30* (2013.01); *G06F 1/28* (2013.01); *G06F 1/3296* (2013.01); *G11C 5/14* (2013.01)

(58) Field of Classification Search
CPC ........................................................ G11C 5/14
USPC ........................................................ 365/226
See application file for complete search history.

(56) References Cited

U.S. PATENT DOCUMENTS

2016/0225459 A1 *  8/2016  Boysan ............... G11C 11/5621

* cited by examiner

*Primary Examiner* — Jason Lappas
(74) *Attorney, Agent, or Firm* — Holland & Hart LLP

(57) ABSTRACT

A memory device may include a pin for receiving a direct current (DC) voltage indicating an operating configuration setting of the memory device and for communicating an alternating current (AC) voltage signal that provides feedback to a power management component. The memory device may determine that a supply voltage is outside of a target range, and may drive the AC signal onto the pin based on determining that the supply voltage is outside the range. The pin may be coupled with a capacitive component the passes the AC signal and blocks the DC signal. The power management component may receive the capacitively coupled AC signal and may maintain or adjust the supply voltage based on the received AC signal.

20 Claims, 7 Drawing Sheets

FEEDBACK FOR POWER MANAGEMENT OF A MEMORY DIE USING CAPACITIVE COUPLING

CROSS REFERENCE

The present Application for Patent is a divisional of U.S. patent application Ser. No. 17/514,858 by Choi et al., entitled "FEEDBACK FOR POWER MANAGEMENT OF A MEMORY DIE USING CAPACITIVE COUPLING," filed Oct. 29, 2021, which is a divisional of U.S. patent application Ser. No. 16/798,893 by Choi et al., entitled "FEEDBACK FOR POWER MANAGEMENT OF A MEMORY DIE USING CAPACITIVE COUPLING," filed Feb. 24, 2020, each of which is assigned to the assignee hereof, and each of which is expressly incorporated by reference in its entirety herein.

BACKGROUND

The following relates generally to one or more memory systems and more specifically to feedback for power management of a memory die using capacitive coupling.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
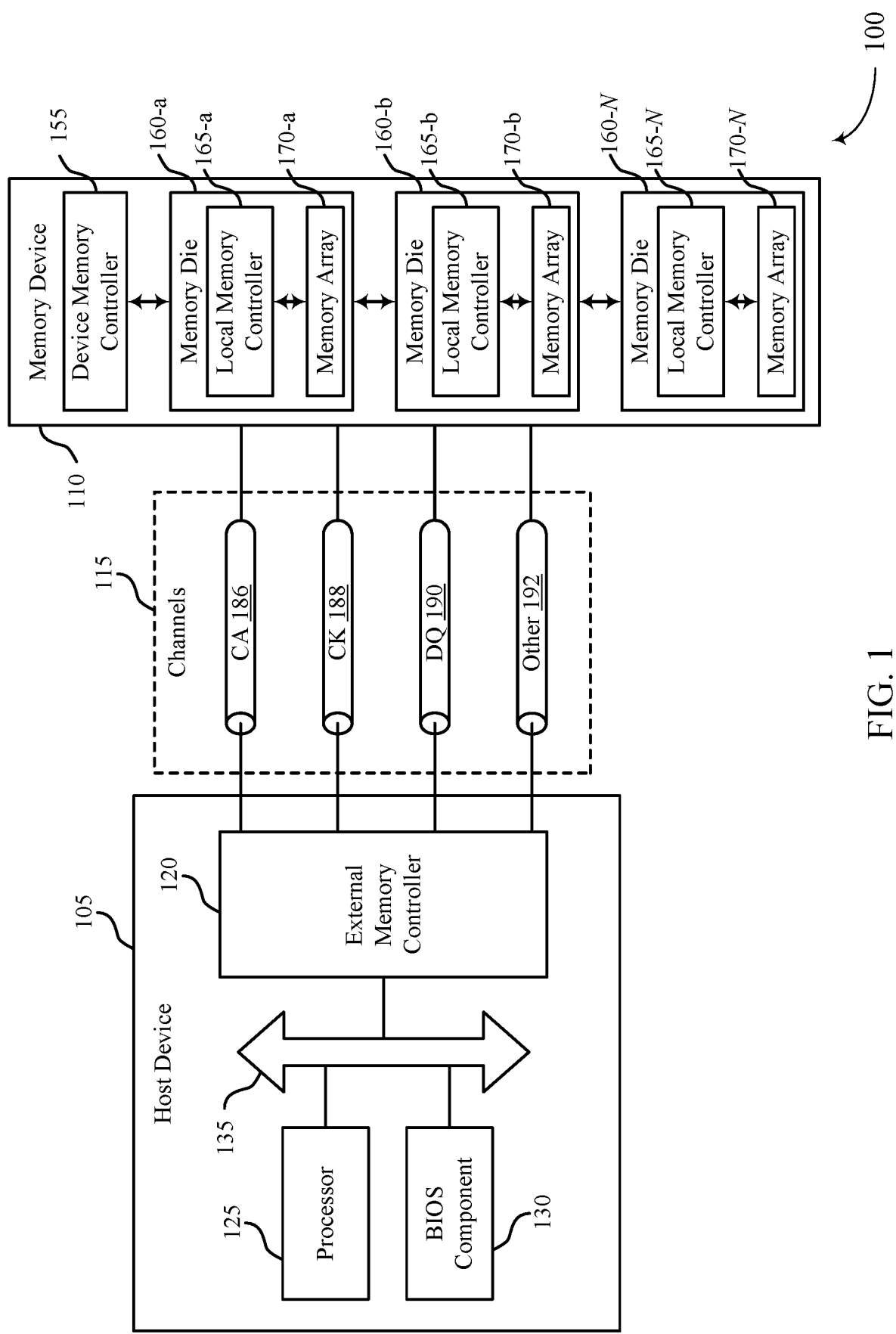
FIG. 1 illustrates an example of a system that supports feedback for power management of a memory die using capacitive coupling in accordance with examples as disclosed herein.

In some memory systems, a power management component, such as a power management integrated circuit (PMIC), may be used to manage the power supplied to one or more memory devices by controlling the voltage of a power supply rail. In some cases, the voltage on a power supply rail may be attenuated at locations farther away from the power management component due to, for example, parasitic capacitance along the rail or other factors. For memory devices that are relatively far away from the power management component, the voltage on the power supply rail may be sufficiently attenuated to drop below a minimum supply voltage, which may cause errors at the memory device. A power management component may not have access to information about the voltage at various locations along the rail, however, and may not be able to adjust the power supplied to the rail to compensate for such deviations from a target range of the voltage level.

A memory device may include one or more pins that may be used to configure various operating configuration settings of the memory device, such as a command addressing mode, a test mode, or other configuration settings, by setting (e.g., providing, maintaining) a direct current (DC) voltage (e.g., a constant voltage) at the pin. In some examples, the pin may be coupled with a voltage supply that is set to a particular DC voltage to configure the operating configuration setting of the memory device. In some examples, the memory device may determine (e.g., identify, detect) the DC voltage at the pin during a start-up or initialization procedure and may subsequently operate (e.g., perform memory access operations such as read or write operations, or perform other operations) based on the configuration setting associated with this voltage. In some examples, the memory device may not continuously monitor the voltage at the pin once the configuration setting has been determined, or may occasionally check the voltage at the pin after the start-up or initialization procedure. Thus, such a configuration pin may be available for use by the memory device for other purposes (such as for transmitting signals) some or all of the time after the voltage has been detected by the memory device. Because the pin may be coupled with a voltage source that maintains a DC voltage at the pin, however, it may be challenging to use the pin for transmission of other signals.

A memory device may use (e.g., re-use) such a pin for providing feedback to the power management component about the voltage level of a power supply rail at the memory device. The memory device may provide such feedback by generating an alternating current (AC) signal at the pin that may be transmitted to the power management component using a capacitive coupling approach that blocks the DC voltage at the pin and passes the AC signal. For example, if the memory device determines that the supply voltage is outside of a target range associated with the supply voltage, the memory device may generate an AC feedback signal (such as by generating one or more voltage pulses or other non-constant voltage signals) at a configuration pin of the memory device to indicate that the supply voltage is outside of a target range. The target range may be, for example, a voltage range for a supply voltage at which the memory device is designed to operate properly, such as a supply voltage range specified by a specification document associated with the memory device.

The AC signal generated at the pin may be provided to the power management component using capacitive coupling in which a capacitive component located within a feedback signal path between the memory device and the power management component passes the AC feedback signal while blocking the DC voltage signal. For example, a pin of a memory device may be coupled with a power management component by way of an in-line capacitor between the memory device and the power management component. The in-line capacitor may enable capacitive coupling (e.g., transmission) of an AC signal generated at the pin while blocking (e.g., filtering out) the DC voltage signal generated by the voltage source. In other examples, a pin of the memory device may be coupled with a conductive wire that is in close proximity to another conductive wire that is coupled with the power management component, and the AC signal may be capacitively coupled across the conductive wires by way of parasitic capacitance in the circuitry.

The power management component, in turn, may be operable to detect the capacitively coupled AC signal provided by the memory device. The power management component may use such feedback information to determine whether and how to adjust the power (e.g., a supply voltage) that is supplied to the memory device(s) via the power supply rail.

In some cases, a memory system may include multiple memory devices, each of which may include a configuration pin coupled with the power management component by way of an in-line capacitor (or by way of parasitic capacitance, or both). Each of the memory devices may provide feedback to the power management component as described above, by generating an AC signal at a respective pin of each memory device. In cases where the power management component is coupled with multiple memory devices that each provide feedback by generating an AC signal, the power management component may be operable to detect such feedback separately for each memory device, or to detect combined feedback from all of the memory devices. The power management component may then adjust the voltage of the rail based on the feedback received from one or more memory devices.

The use of capacitive coupling for transmission of an AC feedback signal from the memory device to the power management component as described herein may enable a memory device to provide such feedback using existing pins rather than by adding new pins, thereby reducing the cost and area associated with providing such feedback and potentially enabling backward compatibility with existing designs.

Features of the disclosure are further described below in the context of memory systems and dies with reference to FIG. 1. Features of the disclosure are then described in the context of memory systems with reference to FIGS. 2-4. These and other features of the disclosure are further illustrated by and described with reference to an apparatus diagram and flowcharts in FIGS. 5-7 that relate to feedback for power management of a memory die using capacitive coupling.

FIG. 1 illustrates an example of a system 100 that utilizes one or more memory devices in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

In some examples, a memory die 160 may be coupled with a power management component that is operable to provide one or more supply voltages to the memory die 160. For example, the power management component may supply a VDD voltage, a VSS voltage, a VDDQ voltage, etc. using power supply rails (e.g., conductive lines). The power management component may be operable to maintain a substantially constant supply voltage on the rail to provide power to the memory device 110 or memory die 160 during operation. The power management component may include or may be coupled with one or more voltage supply components that are operable to generate the appropriate supply voltage. In some cases, the power management component may be referred to as a PMIC or a registered clock device (RCD).

In some cases, the voltage along a power supply rail may decrease along the rail as the distance from the power management component increases due to, for example, parasitic capacitance along the rail. Thus, if multiple memory dies 160 are coupled with a power supply rail that provides a supply voltage to the memory dies 160, a memory die 160 that is relatively far away from the power management component may receive a lower supply voltage than a memory die 160 that is closer to the power management component. In some cases, if the supply voltage dips below a lower voltage threshold, the memory die 160 may experience memory errors.

In some examples, a memory die 160 (or memory device 110) may include a configuration pin that may be used for communicating (e.g., receiving) a DC voltage that indicates an operating configuration setting of the memory die. The configuration pin may be coupled with a voltage source that sets the voltage at the pin to a DC voltage indicating a particular operating configuration setting of memory die 160, such as an operational mode that may be specified to the memory die 160 upon startup or initialization. In some cases, such a DC voltage may not be controlled (e.g., may be uncontrolled) by a controller, such as a controller of memory die 160 or another controller. That is, the DC voltage may be maintained at a relatively constant value by a voltage source rather than being controlled and possibly changed by a controller.

In some examples, a memory die 160 may use (e.g., re-use) this pin for providing feedback to the power management component regarding the supply voltage on the power supply rail at the memory die, thereby enabling the power management component to adjust the supply voltage appropriately.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controllers 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

A local memory controller 165 of a memory die 160 may be operable to determine whether a supply voltage is outside a target range associated with the supply voltage. If the local memory controller 165 determines that the supply voltage is outside the target range, the local memory controller 165 may generate an AC signal at a pin of the memory die 160 indicating that the supply voltage is outside of the range. For example, the local memory controller 165 may cause a driver to generate (e.g., drive) an AC signal onto a pin of memory die 160, such as by driving one or more voltage pulses onto the pin.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

Figure 2:
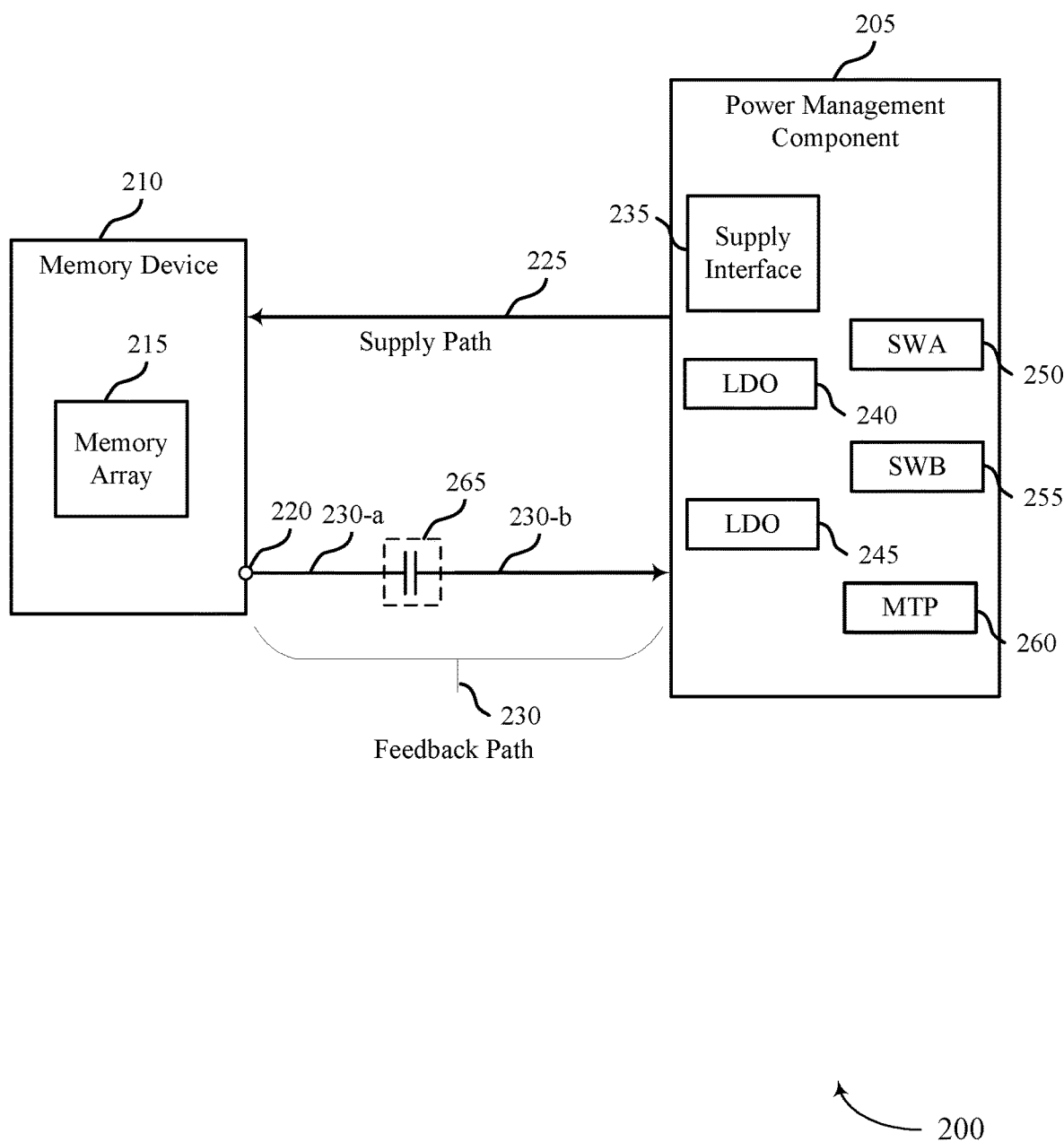
FIG. 2 shows an example of a system that supports feedback for power management of a memory die using capacitive coupling in accordance with examples as disclosed herein.

FIG. 2 illustrates an example of a system 200 that supports feedback for power management of a memory die using capacitive coupling. The system 200 may include a power management component 205, a memory device 210 that includes a memory array 215, and a feedback path 230 and supply path 225 between the power management component 205 and the memory device 210. In the example of system 200, the feedback path 230 and/or supply path 225 may include conductive lines that couple the power management component 205 with the memory device 210. The memory device 210 may be an example of a memory device 110 as described with reference to FIG. 1. Memory array 215 may be an example of memory array 170 as described with reference to FIG. 1.

The power management component 205 may include a supply interface 235, low-dropout regulators (LDO) 240, 245, power supplies (SWA, SWB) 250, 255 (e.g., switching regulators), and multi-time programmable memory (MTP) 260. The supply interface 235 may be operable to receive power to activate the power management component 205 and to be distributed to other components of a memory system (e.g., memory device 210) through the power management component 205.

The low-dropout regulators 240, 245 may be used for outputting power (e.g., DC power) to memory devices of the memory system, including memory device 210. In some cases, the low-dropout regulators 240, 245 may be used to regulate an output voltage, such as a supply voltage. The power supplies 250, 255 may be used for outputting power to memory devices of the memory system, including memory device 210. The power management component 205 may include any quantity of low-dropout regulators (e.g., one, two, three, four, five, six, seven, eight), or may include any quantity of power supplies (e.g., one, two, three, four, five, six, seven, eight), or any quantity of both.

The multi-time programmable memory 260 may be any type of memory used by the power management component 205 for performing the functions described herein. In some cases, the multi-time programmable memory 260 may be an example of an electrically erasable programmable read-only memory (EEPROM) or other type of memory technology. The multi-time programmable memory 260 may be for protecting circuits, improving a reliability of a power-on sequence or a power-off sequence, setting of output voltage (s), setting of output pull-down resistance(s), or other functions, or any combination thereof.

The memory device 210 may include a pin 220 that may be used to configure an operational aspect of the memory device 210, and may be re-used for providing feedback to the power management component 205. A pin 220 may be, for example, a conductive terminal of an integrated circuit package that allows the integrated circuit to be connected with other components or circuitry. A pin 220 may also be referred to as a pad, a socket, a connector, a contact, or a ball (for a ball grid array), for example. In some cases, a pin 220 may be a conductive point that is within an integrated circuit package or external to the integrated circuit package.

The feedback path 230 may be a signal path that enables communication (e.g., transmission) of an AC signal from the pin 220 of the memory device 210 to the power management component 205 by way of a capacitive component 265 positioned along the feedback path 230 between the pin 220 and the power management component 205. Capacitive component 265 may be, for example, one or more discrete capacitors coupled between a first conductive portion 230-a (e.g., a conductive line) of feedback path 230 and a second conductive portion 230-b (e.g., a conductive line) of feedback path 230. In some examples, capacitive component 265 may represent parasitic capacitance between first conductive portion 230-a and second conductive portion 230-b. The feedback path 230 may include any set of one or more conductive lines that establish a communicative link between the memory device 210 and the power management component 205.

The supply path 225 may be a power supply rail (or may be coupled with a power supply rail) to enable the power management component 205 to provide a supply voltage to memory device 210, for example. A supply voltage may be used by memory device 210 during operation of memory device 210, and may include, for example, a VDD voltage, a VSS voltage, or another supply voltage. Although one supply path 225 is depicted in FIG. 2, a memory device may include multiple supply paths 225 between memory device 210 and power management component 205 to enable power management component 205 to provide multiple different supply voltages to memory device 210.

Techniques are provided herein for using pin 220 to provide feedback to the power management component 205 by generating an AC signal at pin 220 based on determining that a supply voltage provided by power management component 205 is outside a target range. The AC signal generated at pin 220 may be communicated (e.g., transmitted) to power management component 205 using capacitive coupling. The capacitively coupled AC signal may be detected by the power management component 205 (and/or by another device, such as a host device) and may be used by the power management component 205 to regulate (e.g., maintain or adjust) a voltage supplied to memory device 210 (e.g., using supply path 225) or to regulate another operational aspect of memory device 210.

Figure 3:
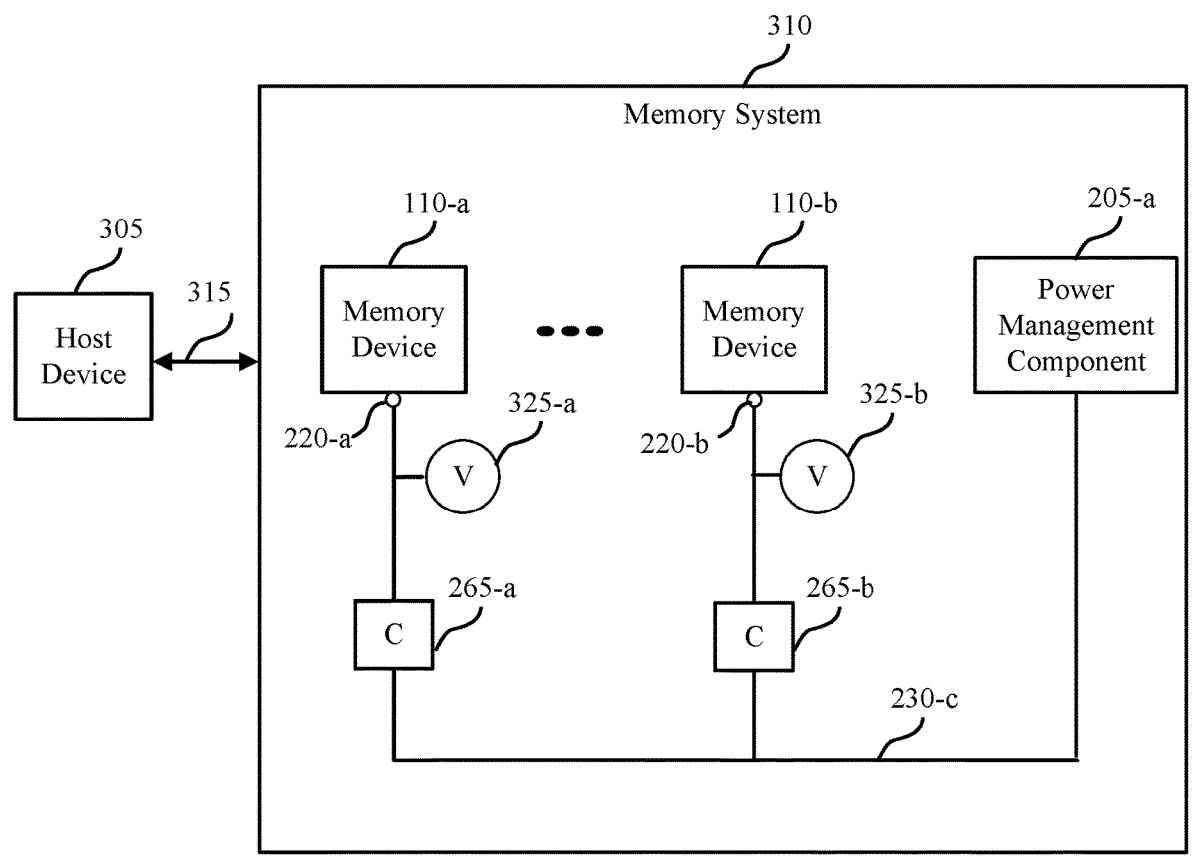
FIG. 3 shows an example of a system that supports feedback for power management of a memory die using capacitive coupling in accordance with examples as disclosed herein.

FIG. 3 illustrates an example of a system 300 in accordance with examples as disclosed herein. The system 300 includes a host device 305 and a memory system 310. The host device 305 and the memory system 310 may be coupled or connected (e.g., electrically) with each other over a channel 315 (e.g., a common channel, a shared channel). The host device 305 may refer to a device that uses the memory system 310 for data storage, or otherwise coordinates the use of the memory system 310 for data storage.

The memory system 310 may include one or more memory devices 110 (e.g., memory devices 110-a, 110-b) that may be examples of a memory device 110 described with reference to FIG. 1, such as a DRAM device. Each memory device 110 may include a pin 220 (e.g., pins 220-a, 220-b) for configuring an operational aspect of respective memory device 110, and for providing feedback to a power management component 205-a. Power management component 205-a may be an example of power management component 205 as described with reference to FIG. 2.

In some examples, a memory system 310 may refer to a set of components that are physically distinct from a host device 305, such as a memory module or a memory assembly. For example, a memory system 310 may refer to a single in-line memory module (SIMM), a dual-in-line memory module (DIMM), or another type of module or assembly. In some cases, a SIMM or DIMM may include a power management component 205-a (e.g., as depicted in memory system 310). In some cases, the power management component 205-a may be external to the SIMM or DIMM.

In some cases, a memory system 310 may include a single DRAM integrated circuit (e.g., a single memory device 110). A memory system 310 may include a first quantity of pins (e.g., 72 pins or another quantity of pins) that may be used, for example, to couple the memory system 310 with a power management component, a host processor, or other electronic components, or for configuring an operational aspect of a memory device 110. Each pin of a memory system 310 may support 32-bit data transfers.

In some cases, a memory system 310 may include a series of DRAM integrated circuits, such as a series of memory devices 110. A memory system 310 may include a second quantity of pins (e.g., 100, 144, 168, 172, 184, 204, 214, 240, or another quantity of pins) that may be used, for example, to couple the memory system 310 with a power management component, a host processor, or other electronic components, or for configuring an operational aspect of a memory device 110. Each pin of a memory system 310 may support 64-bit data transfers. In some cases, the DRAMs in a memory system 310 are coupled with one or more power supply rails, and DRAMs that are farther away from the voltage supply may receive a lower voltage on the power supply rail than DRAMs that are closer to the voltage supply.

In some examples, a pin (e.g., a configuration pin) of a memory device 110 may be coupled with a voltage source that biases (e.g., sets, drives) the voltage at the pin to a DC voltage that indicates an operating configuration setting of memory device 110, such as a configuration of a command address mode or a configuration of a test mode. A memory device 110 may include one or more such configuration pins, each of which may be coupled to the same or different voltage sources, and may be biased to the same or different voltages.

In some examples, a memory device 110 may include one or more pins for receiving a DC voltage that indicates an operating configuration of a command address mode of the memory device. The memory device may perform access operations such as read operations, write operations, or other operations on the memory array based on the operating configuration of the command address mode.

For example, a memory device 110 may include an MIR (mirror) pin that may be used to configure the memory device 110 for operation in either a mirrored command addressing mode or a standard command addressing mode. If the MIR pin is biased to a first DC voltage (e.g., to VDDQ), for example, the memory device 110 may internally swap even-numbered command addresses with the next higher odd-numbered command address. If the MIR pin is biased to a second DC voltage (e.g., to VSSQ), the memory device 110 may not perform such internal swapping of command addresses.

For example, a memory device 110 may include a CAI (command and address inversion) pin that may be used to configure the memory device 110 for operation with the logic levels for command address signals either inverted or not inverted. If the CAI pin is biased to a first DC voltage (e.g., to VDDQ), for example, the memory device 110 may internally invert the logic level present on all of the command address signals. If the CAI pin is biased to a second DC voltage (e.g., to VSSQ), the memory device 110 may not perform such internal inversion of the logic levels for the command address signals.

In some examples, a memory device 110 may include one or more pins for receiving a DC voltage that indicates an operating configuration of a test mode of the memory device 110. The memory device 110 may perform a test operation on the array of memory cells or may operate normally based on the operating configuration of the test mode. For example, a memory device 110 may include a TEN (connectivity test mode enable) pin to configure the memory device 110 with connectivity test mode operation enabled. If the TEN pin is biased to a first voltage (such as a HIGH voltage, or another voltage signal), the connectivity test mode may be enabled, and if the TEN pin is biased to a second voltage. the connectivity test mode may be disabled. When the connectivity test mode is enabled, some of the pins of memory device 110 may be used as test inputs and other pins may be used as test outputs. The memory device 110 can be tested by providing test signals at the test input pins and monitoring outputs at the test output pins. Such a test mode may be enabled for testing a memory device 110 before the memory device 110 is shipped to a customer, for example, and may be disabled during normal operation. Thus, during normal operation of memory device 110, the TEN pin may be biased to a DC voltage (e.g., VSS) indicating that connectivity test mode is disabled. In some examples, the TEN pin may be directly coupled with a VSS voltage source or ground, or may be being internally pulled low through a weak pull-down resistor to a VSS voltage.

In some examples, a memory device 110 may include other pins that are unused some or all of the time during normal operation of memory device 110. For example, a memory device 110 may include one or more LBDQ (loopback data output) pins that may operate as output pins for outputting loopback information when a loopback setting of the memory device 110 indicates that a loopback mode is enabled, such as for testing memory device 110 or for other purposes. Such LBDQ pin(s) may be set to an inactive state (e.g., terminated or set to a high impedance state) when the loopback setting indicates that the loopback mode is disabled, such as during normal operation of memory device 110. Thus, when memory device 110 is not operating in the loopback mode, the LBDQ pin(s) may be available for transmitting feedback information to the power management component.

A memory device 110 may include some or all of the above-described configuration pins or pins that are unused some or all of the time during normal operation of memory device 110, and may include additional such pins that are not described here but that may be used for providing feedback to a power management component as described herein.

In some cases, memory device 110 may determine whether a supply voltage used during operation of memory device 110 is outside of a target range. If memory device 110 determines that the supply voltage is outside of the target range, memory device 110 may generate an AC signal at the pin 220 to indicate that the supply voltage is outside the target range. For example, memory device 110 may drive one or more voltage pulses, sinusoids, or other type of AC signal onto pin 220 to indicate that the supply voltage is outside the target range. In some examples, memory device 110 may generate a first AC signal if memory device determines that the supply voltage is below a lower voltage threshold of the target range, and may generate a second (e.g., different) AC signal based on determining that the supply voltage is above an upper voltage threshold of the target range.

In some examples, memory device 110 may be operable to determine a value (e.g., a voltage value) of the supply voltage. Memory device 110 may indicate the value of the supply voltage by driving a quantity of voltage pulses at the pin 220, where the quantity of voltage pulses indicates the value of the supply voltage. For example, memory device may drive a first quantity of pulses onto the pin 220 based on determining a first value of the supply voltage, and may drive a second quantity of pulses onto the pin 220 based on determining a second value of the supply voltage.

Power management component 205-a may be operable to receive (e.g., detect) an AC signal generated at the pin 220 and transmitted to power management component 205-a using capacitive coupling (e.g., by way of a capacitive component 265 in feedback path 230). For example, power management component 205-a may be operable to detect a quantity of voltage pulses generated at the pin 220, such as a quantity of voltage pulses initiated by the memory device 110 and transmitted to power management component 205-a using capacitive coupling.

The power management component 205-a may, based on the received AC signal, maintain or adjust the power supplied to the memory device 110. Power management component 205-a may for example, maintain, increase, or decrease the voltage on the supply rail using LDO 240, 245, SA 250, 255, MTP 260, or a combination of these components. Memory device 110 may be operable to receive an adjusted supply voltage (e.g., from power management component 205-a) based on (e.g., after) generating an AC signal at the pin 220.

The power management component 205-a may be coupled with multiple memory devices 110-a, 110-b using a feedback path 230-c. Each memory device 110-a, 110-b may be coupled with a respective capacitive component 265-a, 265-b for capacitively coupling an AC signal at a respective pin 220-a, 220-b of the memory device 110-a, 110-b. The capacitive components 265-a, 265-b may be coupled between the pin 220-a, 220-b and the power management component 205-a along respective branches of feedback path 230-c. Each memory device 110-a, 110-b may provide an indication of the supply voltage at the memory device 110 (e.g., by generating an AC signal at a respective pin 220-a, 220-b indicating the supply voltage).

In some cases, each memory device 110 may apply a different drive strength at pin 220 to weight the AC feedback signal of each memory device 110. In some cases, a drive strength may be an amount of electrical current that is sourced (e.g., supplied) or sunk (e.g., received) at pin 220 while outputting or maintaining a given voltage at pin 220. For example, each memory device 110 may be pre-configured to apply a particular drive strength at pin 220 based on, for example, the location of the memory device 110 within the memory system 310 or the proximity (e.g., electrical proximity) of the memory device 110 to the power supply.

In some cases, each memory device 110 may be coupled with power management component 205-a using a separate point-to-point connection (e.g., a separate feedback path), and power management component 205-a may internally weight or otherwise process the feedback from each memory device 110 to determine how to adjust a supply voltage.

Figure 4:
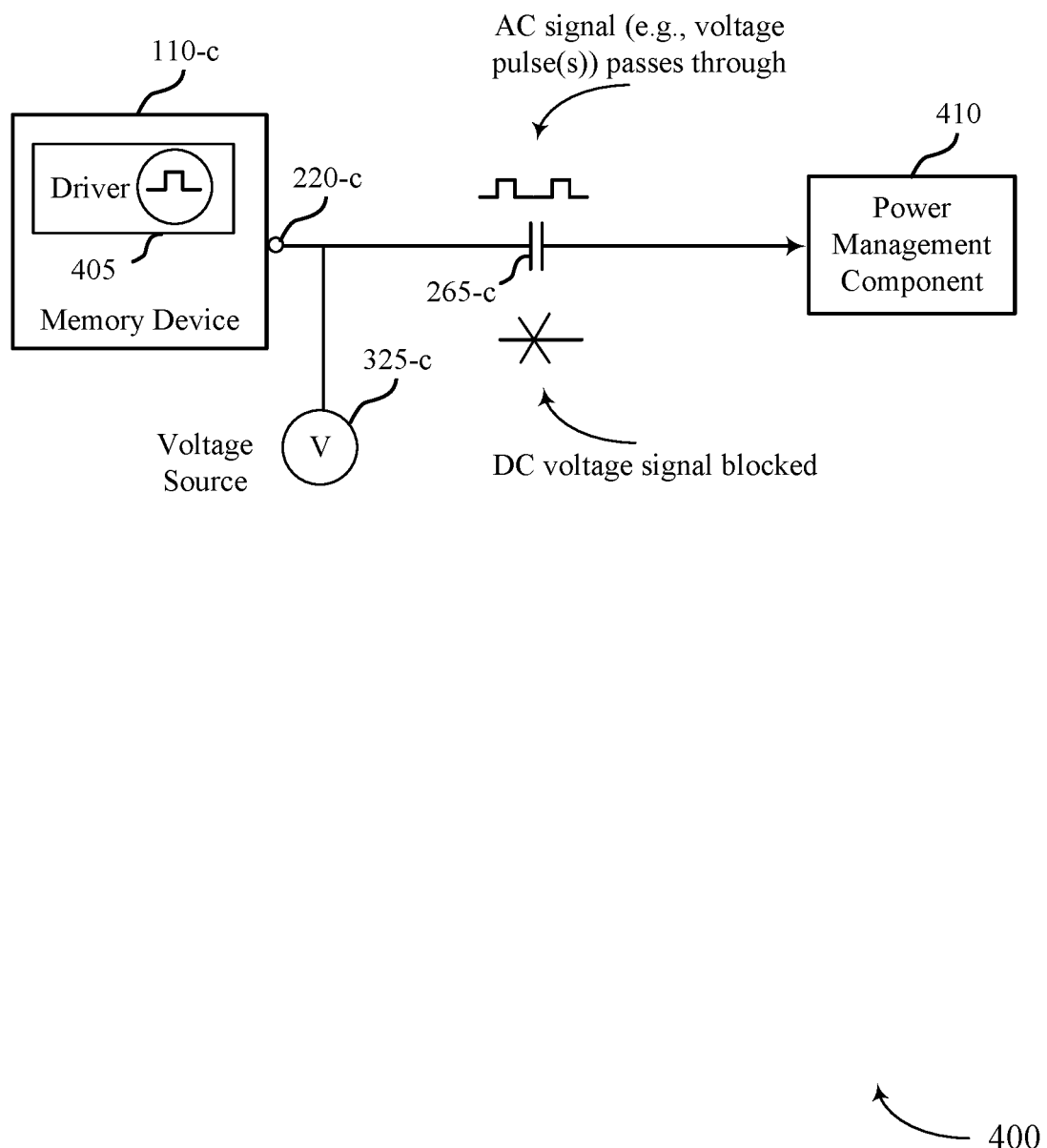
FIG. 4 shows an example of a system that supports feedback for power management of a memory die using capacitive coupling in accordance with examples as disclosed herein.

FIG. 4 depicts an example of a system 400 that support feedback for power management of a memory die using capacitive coupling in accordance with examples disclosed herein. The system 400 includes a memory device 110-c coupled with a power management component 205-b by way of a capacitive component 265-c. Capacitive component 265-c may include a discrete capacitor or may represent parasitic capacitance or both, for example.

Memory device 110-c includes pin 220-c, which may be, for example, an MIR pin, CAI pin, TEN pin, or LBDQ pin as described with reference to FIG. 3, or may be another type of pin. Pin 220-c may be coupled with a voltage source 325-c that may bias a voltage at pin 220-c to specify an operating configuration setting of memory device 110-c. In some examples, voltage source 325-c may be a VDD voltage source, a VDDQ voltage source, a VSS voltage source, or a ground voltage (e.g., pin 220-c may be tied to ground).

Memory device 110-c may include a driver 405 coupled with pin 220-c and operable to drive (e.g., generate) an AC signal onto pin 220-c, such as by driving one or more voltage pulses or other non-constant voltage signals onto pin 220-c. Although driver 405 is depicted as being part of memory device 110-c, in some cases, driver 405 may be external to memory device 110-c. Memory device 110-c may generate and drive an AC signal onto pin 220-c based on determining that a supply voltage is outside a target range, for example. In some cases, if memory device 110-c determines that the supply voltage is within the target range, memory device 110-c may not generate an AC signal, or may generate an AC signal (e.g., a different AC signal) indicating that the supply voltage is within the target range. Thus, memory device 110-c may generate an AC signal at pin 220-c some or all of the time.

A voltage signal at pin 220-*c* may therefore be a combination of a DC voltage signal (e.g., provided by voltage source 325-*c*) and, at times, an AC voltage signal (e.g., generated by driver 405). The AC component of the signal at pin 220-*c* may be communicated to power management component 205-*b* using a capacitive component 265-*c* that is coupled with pin 220-*c* and may pass (e.g., communicate, transmit) the AC voltage signal and block the DC voltage signal. That is, the capacitive component 265-*c*, possibly along with resistance within the circuitry, may function as a high-pass filter that allows the AC voltage signal to be transmitted while filtering out the DC voltage signal. Thus, the power management component 205-*b* may receive the AC voltage signal but not the DC voltage signal. Power management component 205-*b* may, as previously described, maintain or adjust a supply voltage based on the received AC voltage signal.

Figure 5:
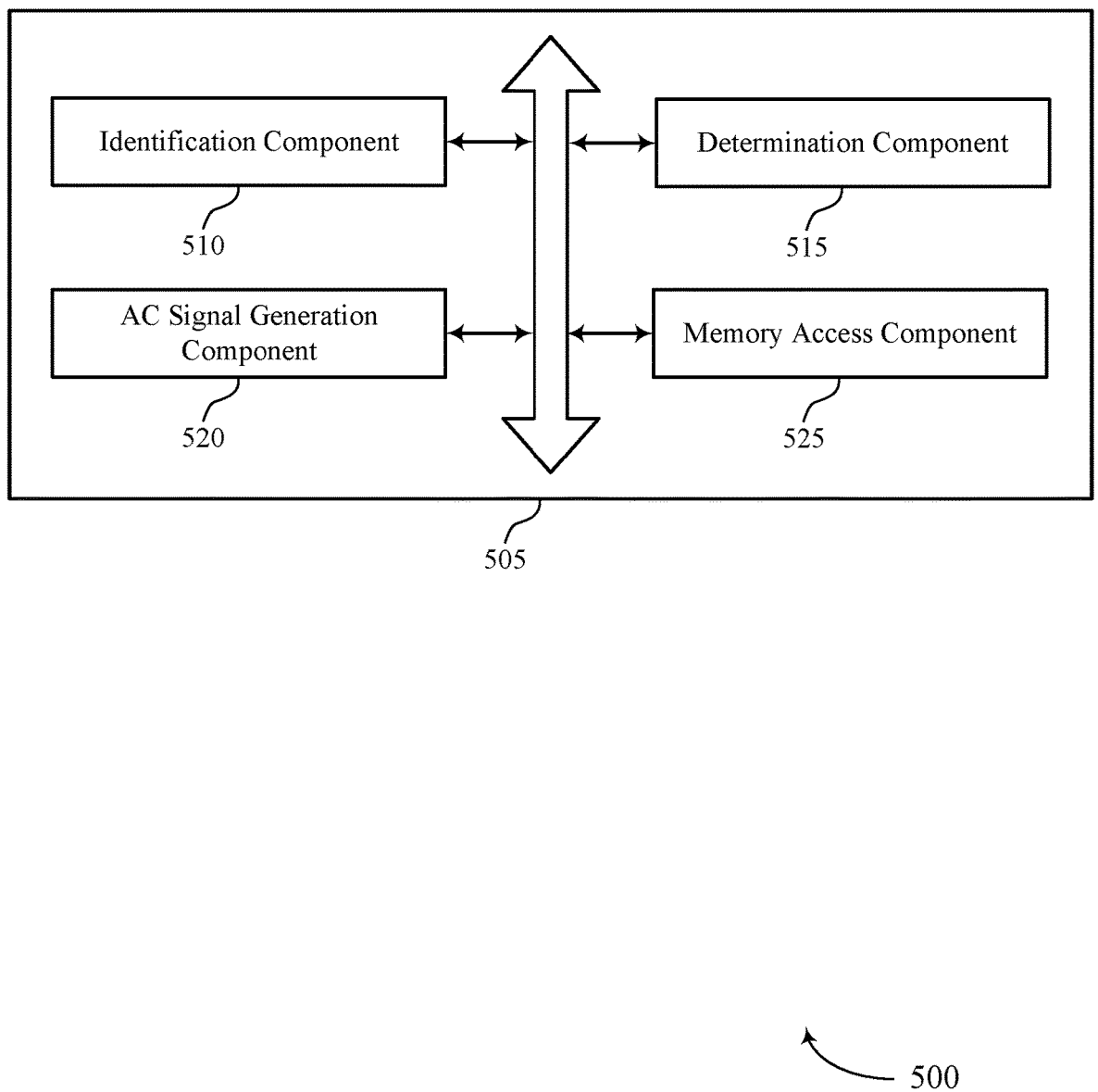
FIG. 5 shows a block diagram of a memory device that supports feedback for power management of a memory die using capacitive coupling in accordance with examples as disclosed herein.

FIG. 5 shows a block diagram 500 of a memory device 505 that supports feedback for power management of a memory die using capacitive coupling in accordance with examples as disclosed herein. The memory device 505 may be an example of aspects of a memory device as described with reference to FIGS. 1 through 4. The memory device 505 may include an identification component 510, a determination component 515, and an AC signal generation component 520. Each of these modules may communicate, directly or indirectly, with one another (e.g., via one or more buses).

The identification component 510 may identify, at a memory device based at least in part on a direct current (DC) voltage at a pin of the memory device, a configuration setting of the memory device. In some examples, the configuration setting indicates a configuration of a command address mode of the memory device or a configuration of a test mode of the memory device.

In some examples, the determination component 515 may determine, after identifying the configuration setting, that a supply voltage for the memory device is outside a target range associated with the supply voltage. In some examples, the determination component 515 may determine a value of the supply voltage. In some examples, the determination component 515 may determine that the supply voltage is below a lower voltage threshold of the target range or above a higher voltage threshold of the target range.

The AC signal generation component 520 may generate an AC signal at the pin of the memory device based on determining that the supply voltage is outside the target range. In some examples, the AC signal generation component 520 may generate an AC signal by generating a quantity of voltage pulses based on the value of the supply voltage or based on determining that the supply voltage is below a lower voltage threshold of the target range. In some examples, the quantity of voltage pulses indicates the value of the supply voltage.

The memory access component 525 may perform a first access operation based at least in part on the configuration setting of the memory device. In some examples, the first access operation is a read operation, a write operation, or a test operation.

Figure 6:
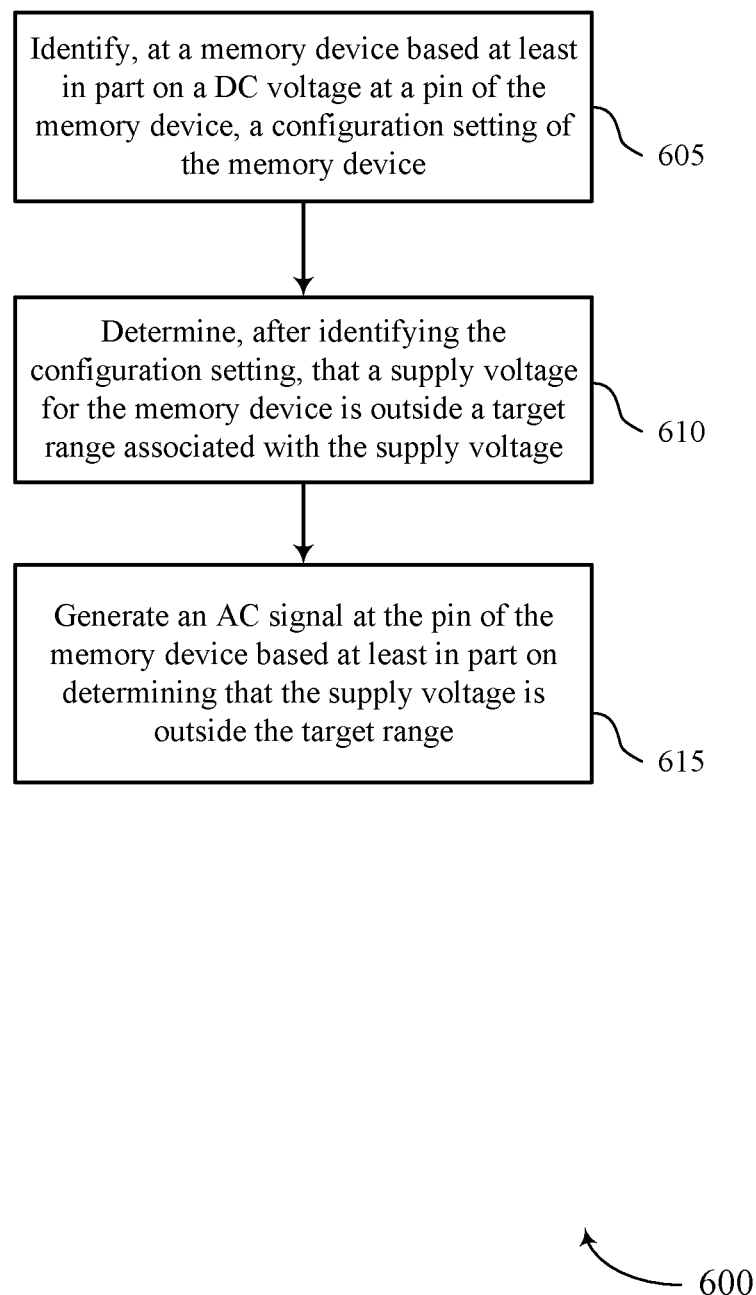
FIGS. 6 and 7 show flowcharts illustrating a method or methods that support feedback for power management of a memory die using capacitive coupling in accordance with examples as disclosed herein.

FIG. 6 shows a flowchart illustrating a method or methods 600 that supports feedback for power management of a memory die using capacitive coupling in accordance with examples as disclosed herein. The operations of method 600 may be implemented by a memory device or its components as described with reference to FIGS. 1-4. In some examples, the operations of method 600 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 605, the memory device may identify, based at least in part on a DC voltage at a pin of the memory device, a configuration setting of the memory device. The operations of 605 may be performed according to the methods described with reference to FIGS. 2-4. In some examples, aspects of the operations of 605 may be performed by an identification component as described with reference to FIG. 5.

At 610, the memory device may determine, after identifying the configuration setting, that a supply voltage for the memory device is outside a target range associated with the supply voltage. The operations of 610 may be performed according to the methods described with reference to FIGS. 2-4. In some examples, aspects of the operations of 610 may be performed by a determination component as described with reference to FIG. 5.

At 615, the memory device may generate an AC signal at the pin based at least in part on determining that the supply voltage is outside the target range. The operations of 615 may be performed according to the methods described with reference to FIGS. 2-4. In some examples, aspects of the operations of 615 may be performed by an AC signal generation component as described with reference to FIG. 5.

In some examples, an apparatus as described herein may perform a method or methods, such as the method 600. The apparatus may include features, means, or instructions (e.g., a non-transitory computer-readable medium storing instructions executable by a processor) for identifying, at a memory device based at least in part on a DC voltage at a pin of the memory device, a configuration setting of the memory device.

Some examples of the method 600 and the apparatus described herein may further include operations, features, means, or instructions for determining, after identifying the configuration setting, that a supply voltage for the memory device is outside a target range associated with the supply voltage. Some examples of the method 600 and the apparatus described herein may further include operations, features, means, or instructions for generating an alternating current (AC) signal at the pin of the memory device based at least in part on determining that the supply voltage is outside the target range.

Figure 7:
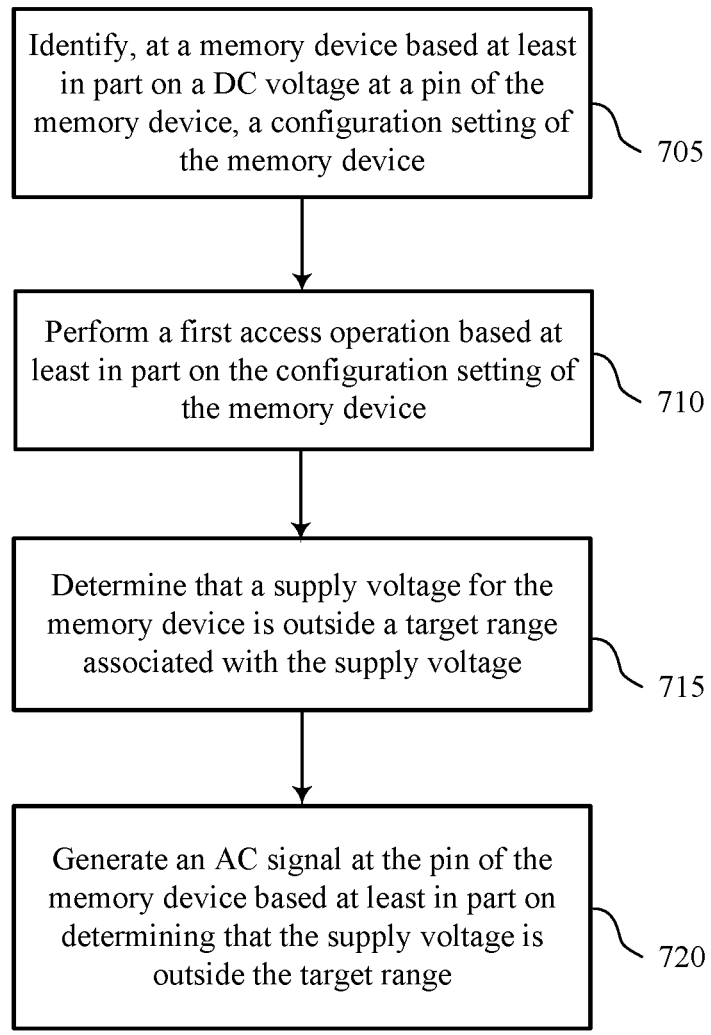

FIG. 7 shows a flowchart illustrating a method or methods 700 that supports feedback for power management of a memory die using capacitive coupling in accordance with examples as disclosed herein. In some examples, the operations of method 700 may be implemented by a memory device or its components as described with reference to FIGS. 1-4. In some examples, the operations of method 700 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 705, the memory device may identify, based at least in part on a DC voltage at a pin of the memory device, a configuration setting of the memory device. The operations of 705 may be performed according to the methods described with reference to FIGS. 2-4. In some examples, aspects of the operations of 705 may be performed by an identification component as described with reference to FIG. 5.

At 710, the memory device may perform a first access operation based at least in part on the configuration setting of the memory device. The operations of 710 may be performed according to the methods described with reference to FIGS. 2-4. In some examples, aspects of the operations of 710 may be performed by a memory access component as described with reference to FIG. 5.

At 715, the memory device may determine that a supply voltage for the memory device is outside a target range associated with the supply voltage. The operations of 715 may be performed according to the methods described with reference to FIGS. 2-4. In some examples, aspects of the operations of 715 may be performed by a determination component as described with reference to FIG. 5.

At 720, the memory device may generate an AC signal at the pin of the memory device based at least in part on determining that the supply voltage is outside the target range. The operations of 720 may be performed according to the methods described with reference to FIGS. 2-4. In some examples, aspects of the operations of 720 may be performed by an AC signal generation component as described with reference to FIG. 5.

In some examples, an apparatus as described herein may perform a method or methods, such as the method 700. The apparatus may include features, means, or instructions (e.g., a non-transitory computer-readable medium storing instructions executable by a processor) for identifying, based at least in part on a DC voltage at a pin of a memory device, a configuration setting of the memory device.

Some examples of the method 700 and the apparatus described herein may further include operations, features, means, or instructions for performing a first access operation based at least in part on the configuration setting of the memory device. Some examples of the method 700 and the apparatus described herein may further include operations, features, means, or instructions for determining, after identifying the configuration setting, that a supply voltage is outside a target range associated with the supply voltage. Some examples of the method 700 and the apparatus described herein may further include operations, features, means, or instructions for generating an AC signal at the pin of the memory device based at least in part on determining that the supply voltage is outside the target range.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include an array of memory cells, a pin for communicating a DC voltage that indicates an operating configuration setting of the apparatus, a capacitive component coupled with the pin and for communicating an AC signal at the pin, and a controller operable to cause the apparatus to determine that a supply voltage for the array of memory cells is outside a target range associated with the supply voltage and generate the AC signal at the pin based on determining that the supply voltage is outside the target range.

Some examples of the apparatus may include a driver coupled with the pin and the controller and operable to generate the AC signal by generating a quantity of voltage pulses at the pin based on a signal received from the controller. Some examples may further include determining a value of the supply voltage, where the quantity of voltage pulses may be based on the value of the supply voltage. Some examples of the apparatus may include a voltage source coupled with the pin and configured to generate the DC voltage.

Some examples may further include determining the operating configuration of the apparatus based on the DC voltage at the pin, where the operating configuration indicates a configuration of a command address mode of the apparatus or a configuration of a test mode of the apparatus. Some examples may further include performing, before determining that the supply voltage may be outside the target range, an access operation on the array of memory cells based on the operating configuration.

Some examples may further include performing, before determining that the supply voltage may be outside the target range, a test operation on the array of memory cells based on the operating configuration. Some examples may further include determining, at a first time, that the supply voltage may be below a lower voltage threshold of the target range, where determining that the supply voltage may be outside of the target range may be based on determining that the supply voltage may be below the lower voltage threshold, and generate a first AC signal based on determining that the supply voltage may be below the lower voltage threshold, where generating the AC signal includes generating the first AC signal.

Some examples may further include determining, at a second time different than the first time, that the supply voltage may be above an upper voltage threshold of the target range, and generate a second AC signal based on determining that the supply voltage may be above the upper voltage threshold. In some examples, the capacitive component includes a discrete capacitor.

An apparatus is described. The apparatus may include an array of memory cells, a pin for providing output of loopback information based on a loopback setting of the apparatus, a capacitive component coupled with the pin for communicating AC signal at the pin, a controller operable to cause the apparatus to, set the pin to an inactive state based on determining that the apparatus is operating in the mode different than the loopback mode, determine, after setting the pin to the inactive state, that a supply voltage for the array of memory cells is outside a target range associated with the supply voltage, and generate the AC signal at the pin based on determining that the supply voltage is outside the target range.

In some examples, setting the pin to the inactive state may include operations, features, means, or instructions for setting the pin to a high impedance state or terminating the pin. Some examples may further include determining that the loopback setting indicates that the apparatus may be operating in the loopback mode, and provide the output based on determining that the loopback setting indicates that the apparatus may be operating in the loopback mode. In some examples, generating the AC signal may include operations, features, means, or instructions for generating a quantity of voltage pulses at the pin.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   an array of memory cells;
   a pin for providing output of loopback information based at least in part on a loopback setting of the apparatus;
   a capacitive component coupled with the pin for communicating an alternating current (AC) signal at the pin; and
   a controller operable to cause the apparatus to:
   determine that the loopback setting indicates that the apparatus is operating in a mode different than a loopback mode;
   set the pin to an inactive state based at least in part on determining that the apparatus is operating in the mode different than the loopback mode;
   determine, after setting the pin to the inactive state, that a supply voltage for the array of memory cells is outside a target range associated with the supply voltage; and
   generate the AC signal at the pin based at least in part on determining that the supply voltage is outside the target range.

2. The apparatus of claim 1, wherein setting the pin to the inactive state comprises setting the pin to a high impedance state or terminating the pin.

3. The apparatus of claim 1, wherein the controller is further operable to cause the apparatus to:
   determine that the loopback setting indicates that the apparatus is operating in the loopback mode; and
   provide the output based at least in part on determining that the loopback setting indicates that the apparatus is operating in the loopback mode.

4. The apparatus of claim 1, wherein generating the AC signal comprises generating a quantity of voltage pulses at the pin.

5. The apparatus of claim 1, further comprising:
   a driver coupled with the pin and the controller and operable to generate the AC signal by generating a quantity of voltage pulses at the pin based at least in part on a signal received from the controller.

6. The apparatus of claim 5, wherein the controller is further operable to cause the apparatus to:
   determine a value of the supply voltage, wherein the quantity of voltage pulses is based at least in part on the value of the supply voltage.

7. The apparatus of claim 1, wherein the controller is further operable to cause the apparatus to:
   determine, at a first time, that the supply voltage is below a lower voltage threshold of the target range, wherein determining that the supply voltage is outside of the target range is based at least in part on determining that the supply voltage is below the lower voltage threshold; and
   generate a first AC signal based at least in part on determining that the supply voltage is below the lower voltage threshold, wherein generating the AC signal comprises generating the first AC signal.

8. A method, comprising:
   determining that a loopback setting of a pin for providing output of loopback information indicates that a memory device comprising the pin, a capacitive component coupled with the pin for communicating an alternative current (AC) signal at the pin, and an array of memory cells is operating in a mode different than a loopback mode;
   setting the pin to an inactive state based at least in part on determining that the memory device is operating in the mode different than the loopback mode;
   determining, after setting the pin to the inactive state, that a supply voltage for the array of memory cells is outside a target range associated with the supply voltage; and
   generating the AC signal at the pin based at least in part on determining that the supply voltage is outside the target range.

9. The method of claim 8, wherein setting the pin to the inactive state comprises setting the pin to a high impedance state or terminating the pin.

10. The method of claim 8, further comprising:
    determining that the loopback setting indicates that the memory device is operating in the loopback mode; and
    providing the output based at least in part on determining that the loopback setting indicates that the memory device is operating in the loopback mode.

11. The method of claim 8, wherein generating the AC signal comprises generating a quantity of voltage pulses at the pin.

12. The method of claim 8, wherein the memory device further comprises a driver coupled with the pin and operable to generate the AC signal by generating a quantity of voltage pulses at the pin based at least in part on a signal received from a controller of the memory device.

13. The method of claim 12, further comprising:
    determining a value of the supply voltage, wherein the quantity of voltage pulses is based at least in part on the value of the supply voltage.

14. The method of claim 8, further comprising:
    determining, at a first time, that the supply voltage is below a lower voltage threshold of the target range, wherein determining that the supply voltage is outside of the target range is based at least in part on determining that the supply voltage is below the lower voltage threshold; and
    generating a first AC signal based at least in part on determining that the supply voltage is below the lower voltage threshold, wherein generating the AC signal comprises generating the first AC signal.

15. A non-transitory computer-readable medium storing code, the code comprising instructions executable by a processor to:
- determine that a loopback setting of a pin for providing output of loopback information indicates that a memory device comprising the pin, a capacitive component coupled with the pin for communicating an alternative current (AC) signal at the pin, and an array of memory cells is operating in a mode different than a loopback mode;
- set the pin to an inactive state based at least in part on determining that the memory device is operating in the mode different than the loopback mode;
- determine, after setting the pin to the inactive state, that a supply voltage for the array of memory cells is outside a target range associated with the supply voltage; and
- generate the AC signal at the pin based at least in part on determining that the supply voltage is outside the target range.

16. The non-transitory computer-readable medium of claim 15, wherein setting the pin to the inactive state comprises setting the pin to a high impedance state or terminating the pin.

17. The non-transitory computer-readable medium of claim 15, wherein the instructions are further executable by the processor to:
- determine that the loopback setting indicates that the memory device is operating in the loopback mode; and
- provide the output based at least in part on determining that the loopback setting indicates that the memory device is operating in the loopback mode.

18. The non-transitory computer-readable medium of claim 15, wherein generating the AC signal comprises generating a quantity of voltage pulses at the pin.

19. The non-transitory computer-readable medium of claim 15, wherein the memory device further comprises a driver coupled with the pin and operable to generate the AC signal by generating a quantity of voltage pulses at the pin based at least in part on a signal received from a controller of the memory device.

20. The non-transitory computer-readable medium of claim 19, wherein the instructions are further executable by the processor to:
- determine a value of the supply voltage, wherein the quantity of voltage pulses is based at least in part on the value of the supply voltage.

* * * * *